US005881728A

United States Patent [19]
Mistretta et al.

[11] Patent Number: 5,881,728
[45] Date of Patent: Mar. 16, 1999

[54] DIGITAL SUBTRACTION MAGNETIC RESONANCE ANGIOGRAPHY WITH IMAGE ARTIFACT SUPPRESSION

[75] Inventors: Charles A. Mistretta; Thomas M. Grist; Richard Frayne; Frank Korosec, all of Madison, Wis.

[73] Assignee: Wisconsin Alumni Research Foundation, Madison, Wis.

[21] Appl. No.: 686,795

[22] Filed: Jul. 26, 1996

[51] Int. Cl.[6] .................................................. A61B 5/055
[52] U.S. Cl. ................................... 128/653.4; 128/653.3; 128/654; 324/309; 324/307
[58] Field of Search ............................... 128/653.2, 653.3, 128/653.4, 654; 324/307, 309, 312

[56] References Cited

U.S. PATENT DOCUMENTS

| | | | |
|---|---|---|---|
| 4,204,225 | 5/1980 | Mistretta | 358/111 |
| 4,204,226 | 5/1980 | Mistretta | 358/111 |
| 4,803,012 | 2/1989 | Riederer | 128/653 |
| 5,166,875 | 11/1992 | Machida | 364/413.13 |
| 5,348,011 | 9/1994 | NessAiver | 128/653.2 |
| 5,377,680 | 1/1995 | Berstein et al. | 128/653.2 |
| 5,417,213 | 5/1995 | Prince | 128/653.3 |
| 5,451,876 | 9/1995 | Sandford et al. | 324/322 |

FOREIGN PATENT DOCUMENTS

| | | |
|---|---|---|
| 0 543 468 A1 | 5/1993 | European Pat. Off. . |
| 0 599 456 A1 | 6/1994 | European Pat. Off. . |
| WO 91/14186 | 9/1991 | WIPO . |
| WO 96/04567 | 2/1996 | WIPO . |

OTHER PUBLICATIONS

*Improved Ejection Fraction and Flow Velocity Estimates with Use of View Sharing and Uniform Repetition Time Excitation with Fast Cardiac Techniques,* Radiology 1995; 195:471–478, Foo et al.

*Block Regional Interpolation Scheme for k–Space (BRISK): A Rapid Cardiac Imaging Techique,* MRM 33:163–170 (1995), Doyle, et al.

*Breath–hold Cine MR Imaging with a Shared and Reordered Gradient Echo Technique,* Siemens Medical Engineering, Erlangen, Germany, p. 478.

*MR Fluoroscopy: Technical Feasibility,* MRM 8, 1–15 (1988), Riederer, et al.

*Method for Accelerated Perfusion Imaging,* van Vaals, et al., p. 1139.

*Simulation of Spatial and Contrast Distortions in Keyhole Imaging,* MRM 31:320–322 (1994), Spraggins.

*Primary Examiner*—Marvin M. Lateef
*Assistant Examiner*—Eleni Mantis Mercader
*Attorney, Agent, or Firm*—Quarles & Brady

[57] ABSTRACT

A dynamic MRA study of a subject is performed using a 3D fast gradient-recalled echo pulse sequence. The frame rate of the resulting series of reconstructed images is increased by sampling a central region of k-space at a higher rate than the peripheral regions of k-space. Artifacts caused by variations in signal strength as the contrast agent enters the region of interest are reduced by renormalizing the acquired data. 2D image frames are reconstructed using planes passing near the center of k-space to enable the operator to select which 3D data sets should be used to reconstruct diagnostic images.

15 Claims, 6 Drawing Sheets

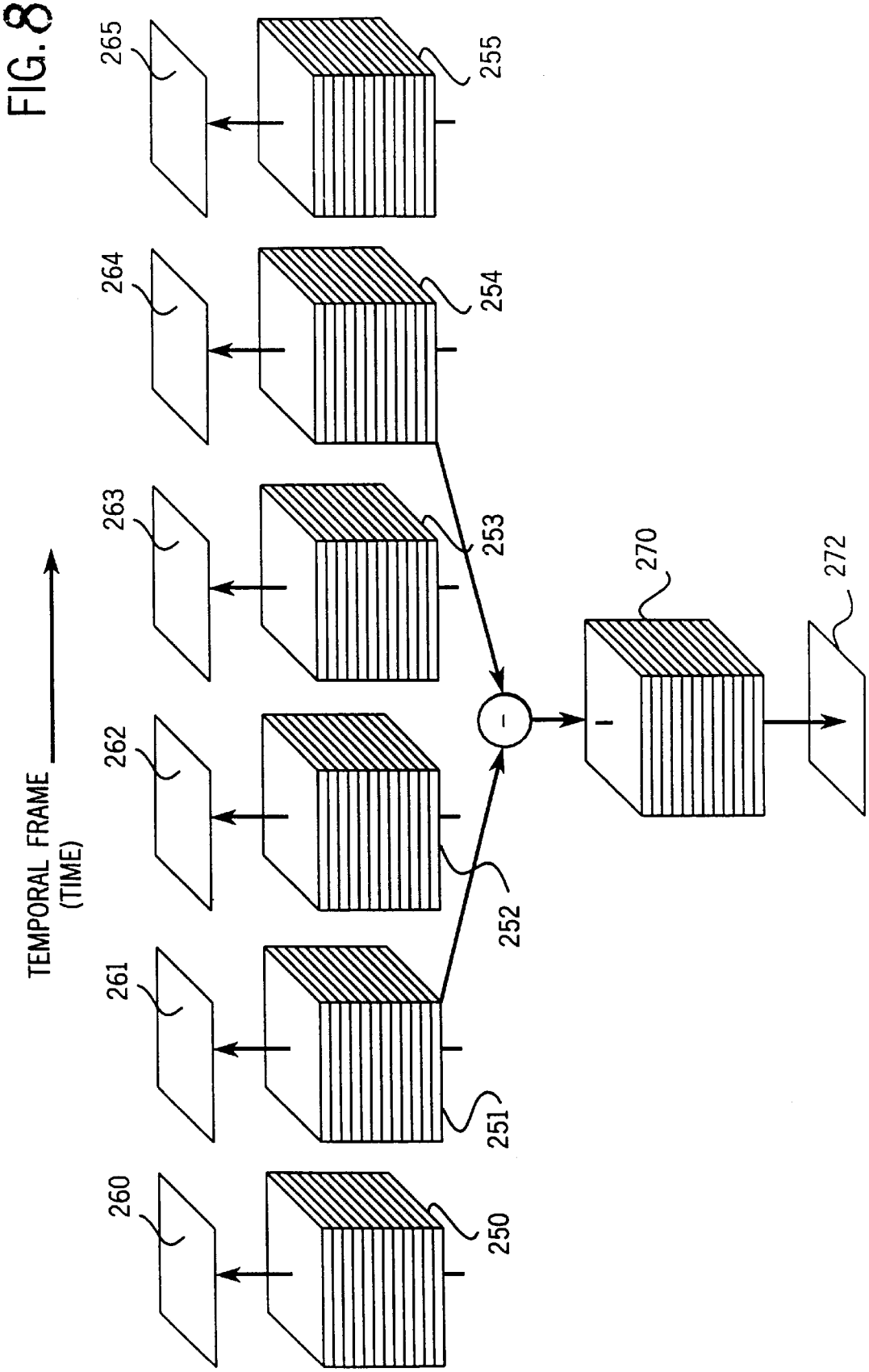

DIGITAL SUBTRACTION MAGNETIC RESONANCE ANGIOGRAPHY WITH IMAGE ARTIFACT SUPPRESSION

This invention was made with United States Government support awarded by NIH Grant Nos: HL02848 and HL51370. The United States Government has certain rights in this invention.

BACKGROUND OF THE INVENTION

The field of the invention is magnetic resonance angiography ("MRA"), and particularly, dynamic studies of the human vasculature using contrast agents which enhance the NMR signals.

Diagnostic studies of the human vasculature have many medical applications. X-ray imaging methods such as digital subtraction angiography ("DSA") have found wide use in the visualization of the cardiovascular system, including the heart and associated blood vessels. Images showing the circulation of blood in the arteries and veins of the kidneys and the carotid arteries and veins of the neck and head have immense diagnostic utility. Unfortunately, however, these x-ray methods subject the patient to potentially harmful ionizing radiation and often require the use of an invasive catheter to inject a contrast agent into the vasculature to be imaged.

One of the advantages of these x-ray techniques is that image data can be acquired at a high rate (i.e. high temporal resolution) so that a sequence of images may be acquired during injection of the contrast agent. Such "dynamic studies" enable one to select the image in which the bolus of contrast agent is flowing through the vasculature of interest. Earlier images in the sequence may not have sufficient contrast in the suspect vasculature, and later images may become difficult to interpret as the contrast agent reaches veins and diffuses into surrounding tissues. Subtractive methods such as that disclosed in U.S. Pat. No. 4,204,225 entitled "Real-Time Digital X-ray Subtraction Imaging" may be used to significantly enhance the diagnostic usefulness of such images.

Magnetic resonance angiography (MRA) uses the nuclear magnetic resonance (NMR) phenomenon to produce images of the human vasculature. When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. Each measurement is referred to in the art as a "view" and the number of views determines the resolution of the image. The resulting set of received NMR signals, or views, are digitized and processed to reconstruct the image using one of many well known reconstruction techniques. The total scan time is determined in part by the number of measurement cycles, or views, that are acquired for an image, and therefore, scan time can be reduced at the expense of image resolution by reducing the number of acquired views.

Most NMR scans currently used to produce medical images require many minutes to acquire the necessary data for a clinically useful image. The reduction of this scan time to seconds rather than minutes is the major obstacle in performing clinical dynamic studies using MRI methods. The most common MRI method currently used for non-triggered, time-resolved imaging is to use an echo-planar imaging ("EPI") pulse sequence such as that first described by Peter Mansfield (J. Phys. C. 10: L55–L58, 1977). In principle the EPI scan enables imaging of dynamic processes occurring with periods measured on the order of a few hundred milliseconds. However, time-resolved EPI is otherwise un-suitable for contrast enhanced MRA because it exhibits a low contrast between blood and surrounding tissues due to the long time intervals (e.g. 100 ms) between RF excitations. EPI also has enhanced sensitivity to a variety of flow-related artifacts, and EPI images can be blurred due to $T_2^*$-modulation of k-space.

A number of methods have been developed to increase the temporal resolution of MRI scans using pulse sequences that are applicable to MRA. In a method known in the art as "MR fluoroscopy" and described in U.S. Pat. No. 4,830,012, the subject is scanned by continuously and repeatedly acquiring the N phase encoding views needed for a complete image. Rather than waiting for an entirely new set of N views before reconstructing the next image, however, images are reconstructed at a much higher rate by using the most recent N views. In other words, an image is reconstructed from newly acquired views as well as views used in reconstructing previous images in the dynamic study. While very high temporal rates are achieved with MR fluoroscopy, the image contrast is not satisfactory for MRA because the central views in k-space, which dominate the overall image contrast, are still updated at the much slower inherent scan rate (i.e. N×TR).

Another method for increasing temporal resolution of MRI images is referred to in the art as "keyhole" imaging. As described, for example, by R. A. Jones, et al. in "*Dynamic, Contrast Enhanced, NMR Perfusion Imaging Of Regional Cerebral Ischaemia In Rats Using K-Space Substitution*", SMR Eleventh Annual Meeting 1992 abs. 1138, a sequence of images is acquired during a dynamic study in which a contrast agent is injected in the subject. The first image in the sequence is a reference image in which all the phase encoding views (e.g. 128 views) are acquired. Subsequent images are produced, however, by only acquiring the central views (e.g. the central 32-views). These keyhole scans can obviously be acquired much faster than complete scans and the temporal rate is increased proportionately. The keyhole images are reconstructed using the most recent central k-space views combined with the outer, peripheral k-space views from the reference scan. Unfortunately, in situations where the low spatial frequency changes in the reconstructed images do not capture the evolution of the dynamic study, k-space keyhole imaging is not appropriate. This is a problem when contrast changes in small regions are to be studied, and in such studies the number of central views acquired must be increased to the point where the gain in temporal resolution is lost.

Related to the k-space keyhole imaging method is a method known in the art as limited field of view ("FOV") dynamic imaging. As described, for example, by Hu and Parrish, published in *Magnetic Resonance in Medicine*, Vol. 31, pp. 691–694, 1994, and by Frederickson and Pelc, 3rd SMR, 1, 197.1995; this method is applied to dynamic studies in which the changing part of the image occupies no more than one half the full FOV. A reference image representing the static part of the image is produced at the beginning of the study and a series of images encompassing only the dynamic, central portion of the image are produced using half the number of phase encoding views. These dynamic images can be acquired at a higher temporal rate because only half the number of views (either the odd or even views) need be acquired. The dynamic and static portions of the image are combined to produce a corresponding series of full FOV images. Of course, if changes occur in the static portion of the image, the information obtained from these regions will no longer accurately remove artifacts aliased into the small FOV.

MR angiography (MRA) has been an active area of research. Two basic techniques have been proposed and evaluated. The first class, time-of-flight (TOF) techniques, consists of methods which use the motion of the blood relative to the surrounding tissue. The most common approach is to exploit the differences in signal saturation that exist between flowing blood and stationary tissue. This is know as flow-related enhancement, but this effect is misnamed because the improvement in blood-tissue contrast is actually due to the stationary tissues experiencing many excitation pulses and becoming saturated. Flowing blood, which is moving through the excited section, is continually refreshed by spins experiencing fewer excitation pulses and is, therefore, less saturated. The result is the desired image contrast between the high-signal blood and the low-signal stationary tissues.

MR methods have also been developed that encode motion into the phase of the acquired signal as disclosed in U.S. Pat. No. Re. 32,701. These form the second class of MRA techniques and are known as phase contrast (PC) methods. Currently, most PC MRA techniques acquire two images, with each image having a different sensitivity to the same velocity component. Angiographic images are then obtained by forming either the phase or complex difference between the pair of velocity-encoded images. Phase contrast MRA techniques have been extended so that they are sensitive to velocity components in all three orthogonal directions.

Despite the tremendous strides made in recent years, at many clinical sites MRA is still considered a research tool and is not routinely used in clinical practice. More widespread application of either TOF or PC techniques is hampered by the presence of a variety of deleterious image artifacts, which can mask and, in some cases, even mimic pathology. These artifacts generally result in a lower specificity, as well as compromised sensitivity.

To enhance the diagnostic capability of MRA a contrast agent such as gadolinium can be injected into the patient prior to the MRA scan. As described in U.S. Pat. No. 5,417,213 the trick is to acquire the central k-space views at the moment the bolus of contrast agent is flowing through the vasculature of interest. This is not an easy timing to achieve as part of a routine clinical procedure and a number of solutions have been proposed.

In co-pending U.S. patent application Ser. No. 08/622,718 entitled "Three-Dimensional Digital Subtraction Magnetic Resonance Angiography" a method is described for rapidly acquiring a series of 3D MRA data sets during a dynamic study. While this method provides the desired temporal resolution at clinically suitable image resolutions, two problems are present. First, image artifacts in the form of signal loss inside blood vessels are produced. These artifacts can lead to a misdiagnosis. Second, a huge amount of MRA data is produced during the dynamic study, and the processing time required to reconstruct images is excessive.

SUMMARY OF THE INVENTION

The present invention is an improvement to an MRA dynamic study in which image artifacts caused by variations in signal strength are suppressed, and a clinical image is reconstructed using a substantially reduced amount of processing time. More particularly, the present invention is a method for acquiring a series of 3D NMR data sets during a dynamic study in which contrast agent is injected into the subject, which includes producing a signal C(t) indicative of how the contrast agent is weighting the acquired NMR data during the dynamic study, and normalizing the acquired NMR data such that NMR data used to reconstruct an image is equally weighted. In addition, rather than reconstructing 3D images from each 3D NMR data set in the series, a 2D image is produced using a subset of each 3D NMR data set. The operator may use these 2D images to select the one or two 3D NMR data sets from which the final clinical image will be reconstructed and data in a selected region of interest in these 2D images may be used to produce the weighting signal C(t).

A general object of the invention is to suppress image artifacts produced during a dynamic study. It has been discovered that image artifacts are produced by the different signal strengths that result during the passage of the contrast agent through the region of interest. More particularly, it is the variations that occur during the acquisition of views for any particular image that produce signal loss in vessels. The solution to this problem is to measure these variations by producing a weighting signal C(t) that indicates changes in signal strength due to contrast agent passage and using that weighting signal C(t) to normalize the acquired image data.

Another general object of the invention is to reduce the processing time required to produce a clinical, diagnostic image. Rather than reconstructing each 3D NMR data set, a 2D image is reconstructed using a subset of each acquired 3D NMR data set. The 2D images are quickly reconstructed and the operator can select from them which image frame, or frames should be completely reconstructed. These same 2D images can also be used to produce the weighting signal C(t).

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 8 is a pictorial representation of the data sets for each image frame in the dynamic study and how they are combined to produce an MRA image;

DESCRIPTION OF THE PREFERRED EMBODIMENT

Figure 1:
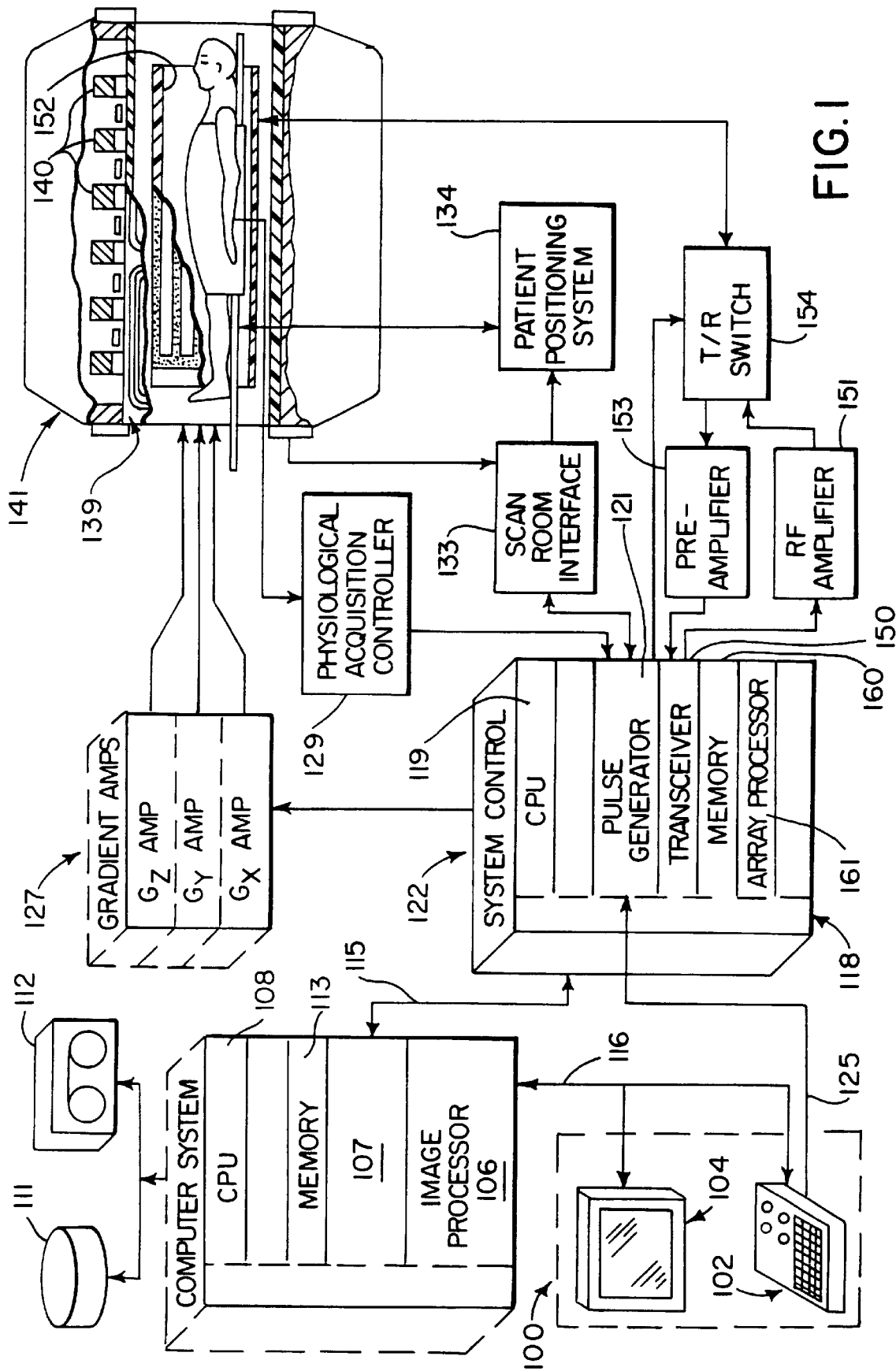
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
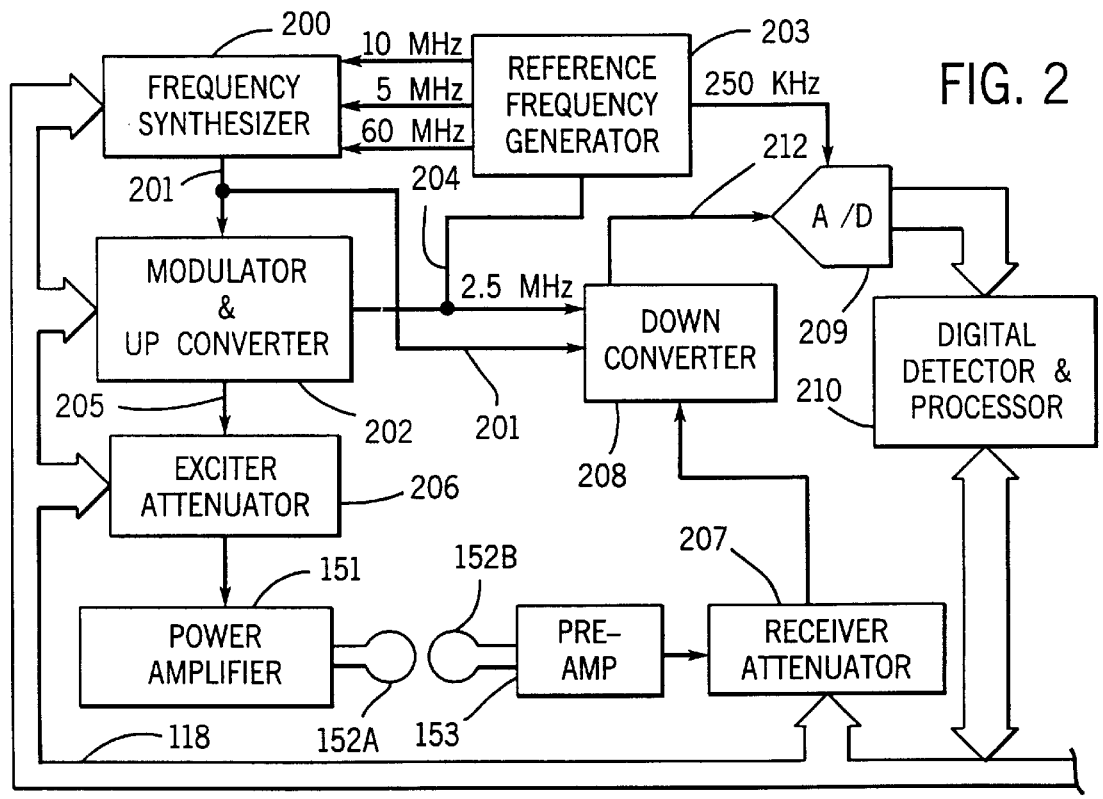
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 Mhz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 KHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

Figure 3:
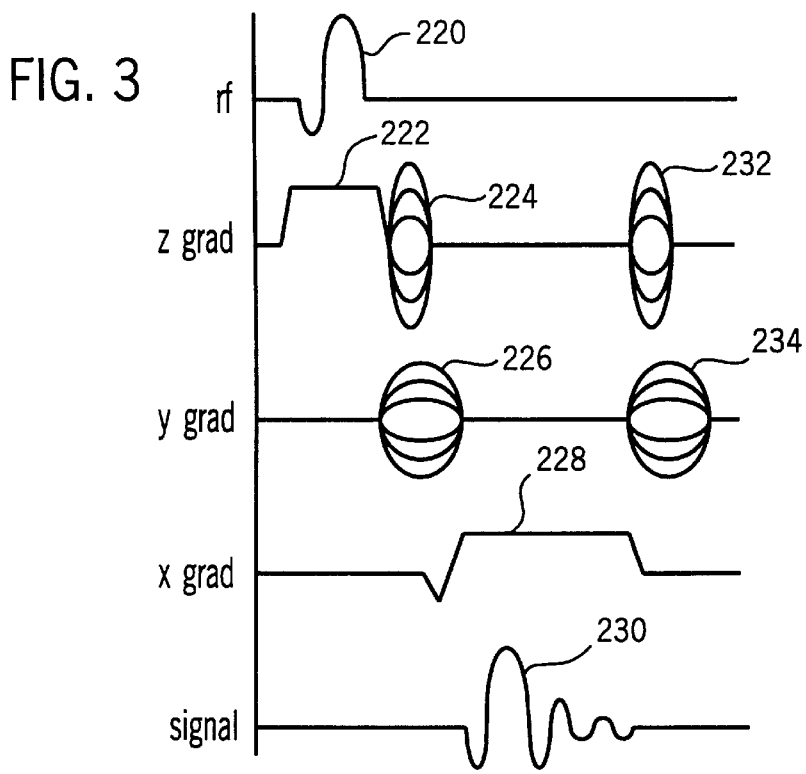
FIG. 3 is a graphic representation of the pulse sequence employed in the preferred embodiment of the invention.

Although the present invention can be used with a number of different pulse sequences, the preferred embodiment of the invention employs a 3D gradient recalled echo pulse sequence depicted in FIG. 3. The pulse sequence "3dfgre" available on the General Electric 1.5 Tesla MR scanner sold under the trademark "SIGNA" with revision level 5.5 system software was used. It was modified to collect data from multiple volumes so that the k-space sampling patterns described below can be practiced.

Referring particularly to FIG. 3, an RF excitation pulse 220 having a flip angle of 60° is produced in the presence of a slab select gradient pulse 222 to produce transverse magnetization in the 3D volume of interest as taught in U.S. Pat. No. 4,431,968. This is followed by a phase encoding gradient pulse 224 directed along the z axis and a phase encoding gradient pulse 226 directed along the y axis. A readout gradient pulse 228 directed along the x axis follows and a partial echo (60%) NMR signal 230 is acquired and digitized as described above. After the acquisition, rewinder gradient pulses 232 and 234 rephase the magnetization before the pulse sequence is repeated as taught in U.S. Pat. No. 4,665,365.

Figure 4:
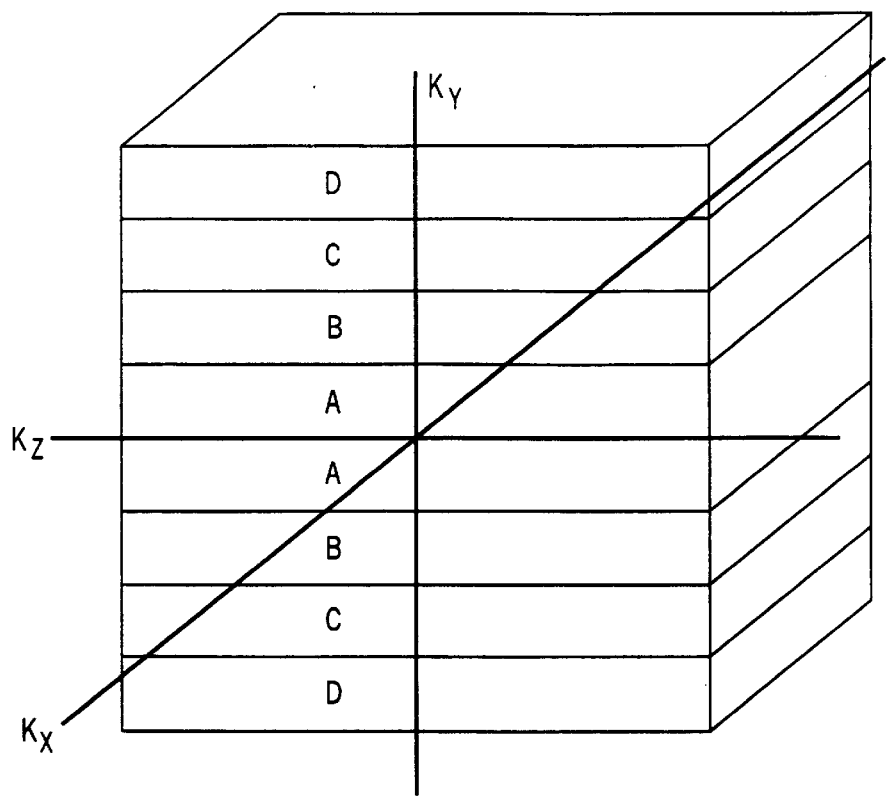
FIG. 4 is a graphic representation of three-dimensional k-space from which data is sampled when practicing the preferred embodiment of the invention.

As is well known in the art, the pulse sequence is repeated and the phase encoding pulses 224 and 226 are stepped through a series of values to sample the 3D k-space depicted in FIG. 4. In the preferred embodiment sixteen phase encodings are employed along the z axis and 128 phase encodings are employed along the y axis. For each particular y phase encoding, therefore, sixteen acquisitions with sixteen different z phase encodings are performed to sample completely along the $k_z$ axis. This is repeated 128 times with 128 different y phase encodings to sample completely along the $k_y$ axis. As will become apparent from the discussion below, the order in which this sampling is performed is important.

Sampling along the $k_x$ axis is performed by sampling the echo signal 230 in the presence of the readout gradient pulse 228 during each pulse sequence. It will be understood by those skilled in the art that only a partial sampling along the $k_x$ axis is performed and the missing data is computed using a homodyne reconstruction or by zero filling. This enables the echo time (TE) of the pulse sequence to be shortened to less than 1.8 to 2.0 ms. and the pulse repetition rate (TR) to be shortened to less than 10.0 msecs.

Referring particularly to FIG. 4, to perform a dynamic study according to the preferred embodiment, the k-space to be sampled is divided into four regions designated "A–D". The boundaries of these regions A–D are disposed along the $k_y$ axis and are symmetrical about $k_y=0$. A central region "A" occupies the central k-space region ranging from $k_y=-16$ to +15, and as is well known in the art, these "central" samples contain most of the information which determines the overall contrast in the reconstructed image. As will now be described, it is this central k-space region A which forms the basis for each frame image in the dynamic study and which determines the eventual temporal frame rate.

The remaining three "peripheral" k-space regions B–D are divided and disposed on opposite sides of the central region A. They occupy k-space over the following ranges:

Region B—$k_y=-17$ to $-32$ and $+16$ to $+31$
Region C—$k_y=-33$ to $-48$ and $+32$ to $+47$
Region D—$k_y=-49$ to $-64$ and $+48$ to $+63$.

The central region of k-space is sampled at a higher rate than the peripheral regions during the dynamic study. In the preferred embodiment this is achieved by alternately sampling the central region A and sequential ones of the peripheral regions B–D. Either of the following sampling sequences are thus performed during the dynamic study:

AB AC AD AB AC AD AB AC AD . . .
AD AC AB AD AC AB AD AC AB . . .

Figure 5:
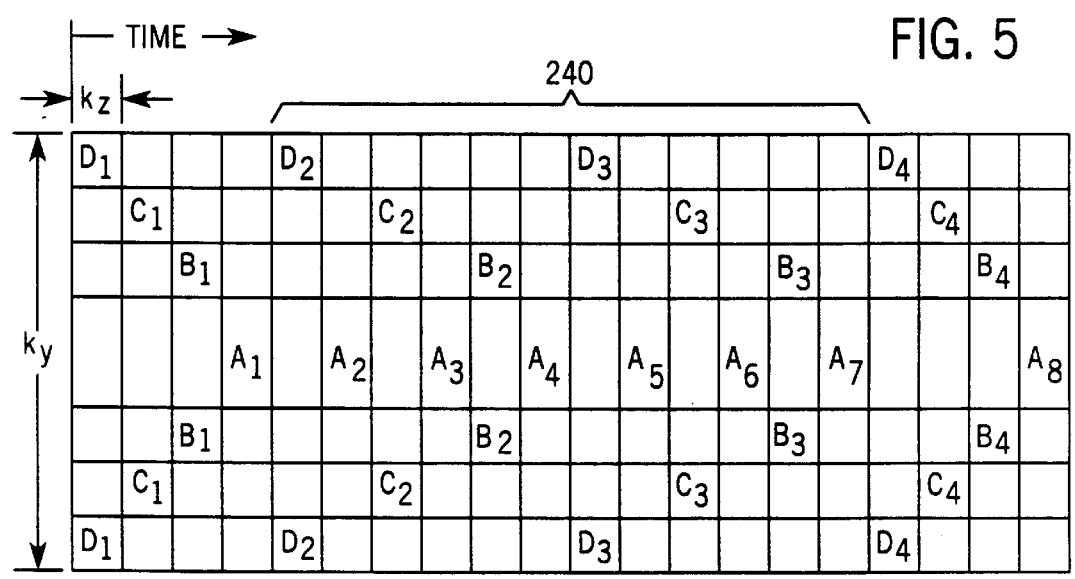
FIG. 5 is a graphic representation of the order in which the three-dimensional k-space of FIG. 4 is sampled.

This latter sampling sequence is shown graphically in FIG. 5, where the horizontal axis indicates real time during the dynamic study and the vertical axis is the region in k-space along the $k_y$ axis that is being sampled. The time periods during which each k-space region A–D is sampled are labelled, and the subscripts indicate the number of times the region has been sampled during the dynamic study. It is readily apparent that the central k-space region A is sampled at a higher temporal rate than the peripheral k-space regions B–D.

In this embodiment all of the regions A–D are scanned at the beginning and again at the end of the dynamic study in order to implement other reconstruction strategies to be discussed below. It can be appreciated that the alternating sequence described above is then performed during the critical time period of the dynamic study indicated at 240. This alternating sequence can be extended as long as necessary to encompass the contrast changes of interest that occur during the particular study.

It can be appreciated by those skilled in the art that k-space can be carved up in other ways to practice the present invention. For example, the number of regions can be changed and they can be oriented such that their boundaries are disposed along the slice-select $k_z$ axis. Also, k-space can be divided into a circular central region and a plurality of surrounding, annular-shaped peripheral regions.

Figure 6:
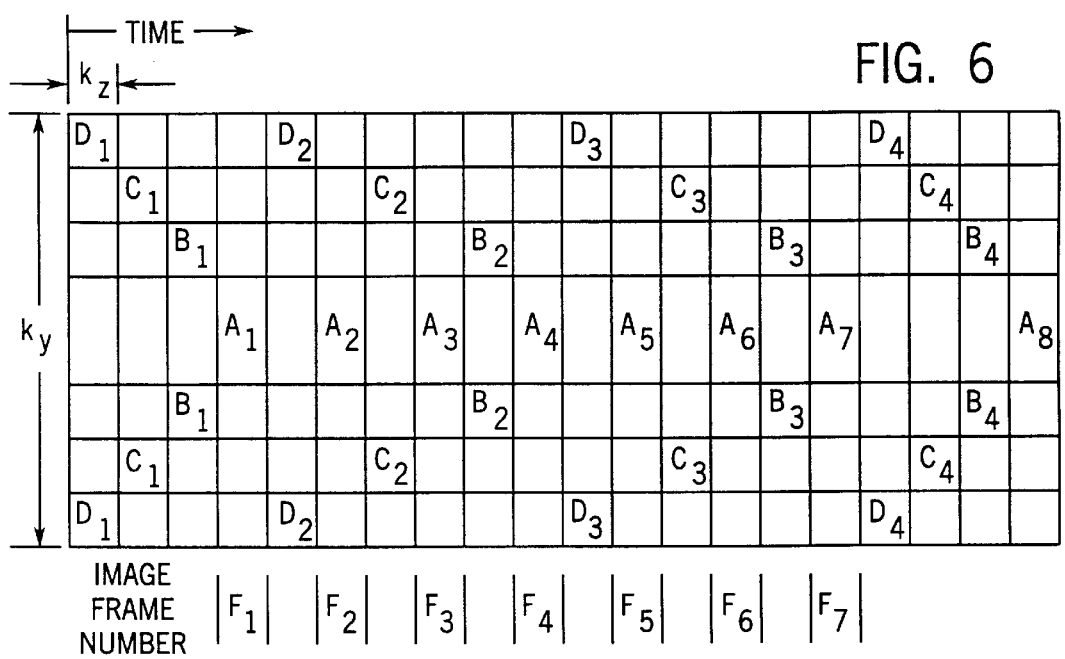
FIG. 6 is a graphic representation of the sampling of the three-dimensional k-space of FIG. 4 showing the times at which each image frame in the dynamic study is reconstructed according to one embodiment of the invention.

The data acquired during the dynamic study can be used in a number of ways to reconstruct a series of frame images $F_1$–$F_n$ that depict contrast changes occurring during the dynamic study. In one embodiment illustrated in FIG. 6, image frames designated $F_1$ through $F_7$ are reconstructed using data from each central k-space region acquisition ($A_1$–$A_7$). This is accomplished by forming a data set sufficient to reconstruct a frame image using the particular central k-space region data combined with temporally adjacent data from the surrounding, peripheral k-space regions B–D. Each image frame data set depicts the subject at a particular time during the dynamic study.

One method for forming each such image frame data set is to use the data acquired from peripheral regions closest in time to the acquisition of the central k-space region A. For frame images $F_2$ through $F_6$ the data acquired and depicted in FIG. 6 may thus be formed into data sets as follows:

$F_2 \rightarrow A_2+B_2+C_2+D_2$
$F_3 \rightarrow A_3+B_2+C_2+(D_2 \text{ or } D_3)$
$F_4 \rightarrow A_4+B_2+(C_2 \text{ or } C_3)+D_3$
$F_5 \rightarrow A_5+(B_2 \text{ or } B_3)+C_3+D_3$
$F_6 \rightarrow A_6+B_3+C_3+(D_3 \text{ or } D_4)$ This method of selecting the data closest in time to that of the image frame is referred to herein as the "nearest neighbor" method. It can be appreciated that sometimes the nearest data for a peripheral region of k-space is close to the frame time, and in other cases the frame time is midway between two sample periods.

Another method for forming a data set at each frame $F_2$ through $F_6$ is to interpolate between the two adjacent sets of data acquired for each peripheral region. A linear interpolation method for forming frame images $F_2$ through $F_6$ from the data acquired and depicted in FIG. 6, for example is as follows:

$F_2 \rightarrow A_2+(B_1+B_2)/2+(4C_2+C_1)/5+(5D_2+D_3)/6$
$F_3 \rightarrow A_3+(5B_2+B_1)/6+(5C_2+C_3)/6+(D_2+D_3)/2$
$F_4 \rightarrow A_4+(5B_2+B_3)/6+(C_2+C_3)/2+(5D_3+D_2)/6$
$F_5 \rightarrow A_5+(B_2+B_3)/2+(5C_3+C_2)/6+(5D_3+D_4)/6$
$F_6 \rightarrow A_6+(5B_3+B_2)/6+(4C_3+C_4)/5+(D_3+D_4)/2$ As described in the above-cited copending U.S. patent application Ser. No. 622,718, it is also possible to produce intermediate frame images (e.g. $F_{2.5}$, $F_{3.5}$, $F_{4.5}$ and $F_{5.5}$) by interpolating between the A regions as well as regions B, C and D.

Figure 7:
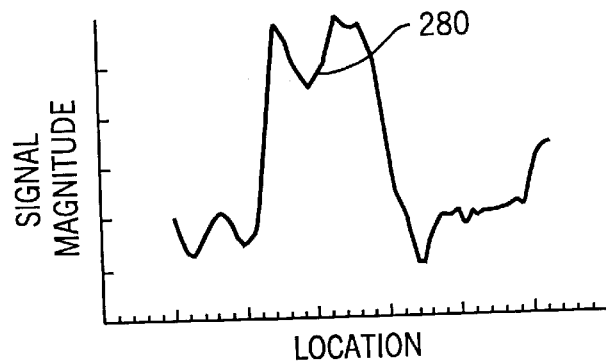
FIG. 7 is a graphic representation of the signal strength through an artery showing a dip in intensity that produces image artifacts.

As indicated above the views used to form the data set at each frame are acquired over a period of time during which contrast agent is flowing into the region of interest ("ROI"). As a result, the amount of contrast agent, and hence the signal strength, may change during the acquisition of the views used to form each data set. It has been discovered that such variations in signal strength result in image artifacts in the reconstructed images which can interfere with proper diagnosis. One such artifact is indicated by the graph in FIG. 7, which is a cross section through a reconstructed image of the aorta, just below the renal arteries. The intensity drop at 280 is an artifact which appears as a shaded region in the center of the artery. One aspect of the present invention is to correct the acquired NMR data to suppress such image artifacts.

The image frame data sets may be employed to reconstruct a corresponding set of 3D frame images using a three-dimensional Fourier transformation method. Six such 3D frame images are shown in FIG. 8 as frame image data sets 250–255, but in practice, thirty such data sets are produced during a typical dynamic study. It requires a great deal of processing time to reconstruct 3D images from such a scan, and another aspect of the present invention is to reduce that processing time.

Referring to FIG. 8, this is accomplished by producing a 2D image from a subset of the 3D k-space data in each of the time frames 250–255. For example, one 2D slice of k-space data, typically a central slice, may be selected from each 3D k-space data set 250–255 and a two-dimensional Fourier transformation performed on it to produce corresponding images 260–265. This process may optionally be repeated using other k-space planes so that the resultant preview images can be averaged to improve image quality. Such 2D reconstructions require approximately 0.5 to 5 seconds each depending on the image size and the computer used, and the operator can have 2D images representative of all thirty (typically) temporal frames about as fast as the data is acquired. Preferably, the first 2D image frame 260 is used as a default reference frame and is subtracted from the subsequent 2D image frames 261–265 as they are produced to form a 2D subtraction series. Alternative reference frames may be chosen simply by subtracting any of the 2D subtraction images from the others. For example, if the 2D subtraction image (261–260) is subtracted from the 2D subtraction image (263–260), the result is a 2D subtraction image in which 2D image frame 261 is the reference (i.e. 263–261). These 2D images 260–265 or related subtraction images can be used for two purposes as will be detailed below.

First, the operator may review each of the 2D images 260–265 and select the one or two which best depict the vasculature of interest. Referring to FIG. 8, for example, if the 2D image 261 and 2D image 264 depict the vasculature before arrival of the contrast agent and at the peak enhancement by the contrast agent, the corresponding 3D frame data sets 251 and 254 are selected for complete processing. While a k-space difference data set may be formed and subjected to a 3D Fourier transformation to provide a 3D difference image data set, in the preferred embodiment each of the k-space data sets 251 and 254 are separately Fourier transformed and subtracted in image space to form a 3D difference image data set 270. This processing of the two optimal data sets produces a reduction of overall processing time by a factor of fifteen relative to reconstruction of all thirty data sets. With available computers of moderate price, the time required for reconstruction of 30 image data sets is five minutes to one hour depending on image size and the number of receiver coils being employed. The above scheme reduces this to less than one minute to four minutes. These time estimates are increased if additional data sets are chosen for reconstruction.

For assessing overall blood vessel structure and health it is usually more useful to project this 3D array of image data 270 into a single 2D projection image 272. The most commonly used technique for doing this is to project a ray from each pixel in the projection image 272 through the 3D array 270 of image data points and select the data point which has the maximum value. The value selected for each ray is used to control the brightness of its corresponding pixel in the projection image 272. This method, referred to hereinafter as the "maximum pixel technique," is very easy to implement and it gives aesthetically pleasing images. It is presently the preferred method.

Another technique which is used to form a projection image 272 and which retains more of the available information is what is referred to hereinafter as the "integration method". This projection method is described in U.S. Pat. No. 5,204,627 entitled "Adaptive NMR Angiographic Projection Method" and is incorporated herein by reference. With this method the brightness of each projection image pixel is determined by the sum of all the data points along the projection ray.

Yet another technique used to produce the projection image 272 uses a 3D region-growing method. The origins of the regions in the 3D image data set to be grown are operator determined. The grown regions are then blurred and thresholded to create a mask which includes voxels just outside the vessel edges, which may have been omitted in the region-growing process. This method gives a very smooth representation of the vasculature in which vessel edges are retained and vessel overlap can be deduced by use of visual cues which are included in the rendering process.

As indicated above the views used to form the data set at each frame are acquired over a period of time during which contrast agent is flowing into the region of interest ("ROI"). As a result, the amount of contrast agent, and hence the signal strength, or weight, may change during the acquisition of the views used to form each data set. It has been discovered that such variations in signal weight result in image artifacts in the reconstructed images. These artifacts can interfere with proper diagnosis. One such artifact is indicated by the graph in FIG. 7, which is a cross section through a reconstructed image of the aorta, just below the renal arteries. The intensity drop at 280 is an artifact which appears as a shaded region in the center of the artery. The solution to this problem is to acquire information regarding the time dependent contrast enhancement of the NMR signals and to use that information to reweight, or normalize, the NMR signals acquired during the dynamic study.

Figure 9:
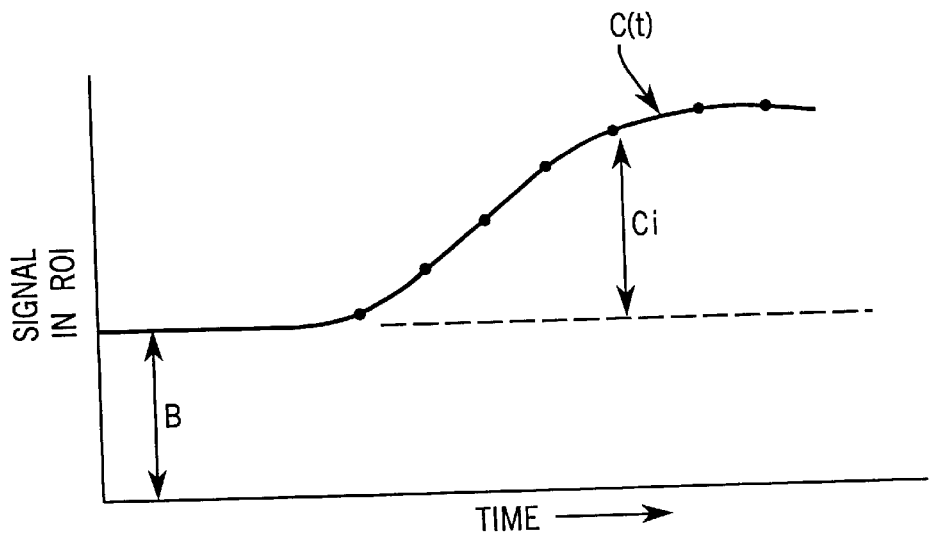
FIG. 9 is a graphic representation of a typical weighting signal C(t) produced during a dynamic study.

Referring particularly to FIG. 9, a typical contrast curve which indicates the variations in NMR signal weight as the contrast agent enters the ROI has a background value (B) measured before the contrast agent arrives. The acquired NMR k-space data ($I_k$) includes a component due to arterial blood flow ($I_{art}$) and a component due to the background ($I_{bkg}$). The arterial component $I_{art}$ experiences increased weighting by the curve (C(t)) above the baseline value B. The background component $I_{bkg}$ is assumed to have a constant weighting during the first pass of the contrast.

$$I_{k(t)} = B*I_{bkg} + [B+C(t)]*I_{art} \quad (1)$$

In order to insure that the reweighting according to the present invention does not cause ghosting of the background, all reweighting is done on subtracted k-space data $\Delta I_k$ formed by subtracting a k-space baseline data, obtained prior to contrast arrival, from the post contrast k-space data. This gives $$\Delta I_k = I_{k(t)} - I_{k(0)} = C(t)*I_{art}. \quad (2)$$

We cannot practically divide by C(t) to remove its variable weighting because of the possibility of dividing by zero. One option is to divide by C(t)+f*B where f is a fraction, for example 0.1. This division produces a new differential k-space data series $\Delta I_k'$ given by $$\Delta I_k' = \Delta I_k / [f*B + C(t)] \quad (3)$$

Figure 10:
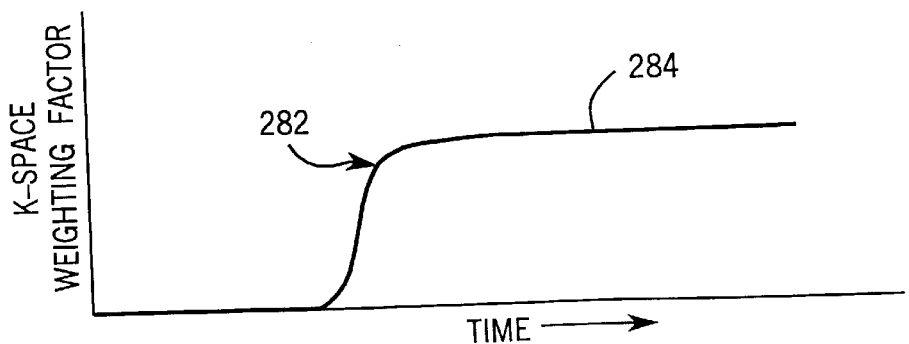
FIG. 10 is a graphic representation of the resultant k-space weighting after the information of FIG. 9 is employed to reweight, or normalize, the corresponding image data.

For small f, this sharpens the onset of the contrast curve and produces a plateau of k-space data having equal weighting as shown in FIG. 10. The sharpness of this curve 282 leads to uniform images without ghosting if all the reweighted views are acquired on the flat plateau 284.

To eliminate all artifacts the k-space views should be acquired only after the contrast agent has arrived at the ROI and the weighting factor plateau has been established. One solution is to perform an ABCD sequence just prior to or immediately after contrast injection, and then continue with A acquisitions (where A refers to the central k-space acquisition discussed above) until the contrast has arrived, at which point the ABACAD sequence is begun. Then a nearest neighbor method looks forward in time from the first A in order to find the next B, C and D k-space acquisitions for the first 3D frame data set in the dynamic study. After that temporal averaging of A's and nearest neighbor selection of the outer k-space portions can be done as described above. The sequence looks like this assuming contrast arrives during the acquisition of A9.

A1, B2, C3, D4, A5, A6, A7, A8, A9, B10, A11, C12, A13, D14, A15, B16, A17, C18, A19, D20 . . .

The baseline is formed from the k-space views A1+B2+C3+D4 and is subtracted from the following k-space data.

A9+B10+C12+D14
B10+(A9+A11)/2+C12+D14 . . .
A11+B10+C12+D14 . . .

This k-space data is then corrected according to equation (3) using a weighting signal C(t). In one embodiment the weighting signal C(t) is produced as the image data is acquired, and this normalization of the image data can be made immediately. As the following discussion will indicate, however, in another embodiment the value of weighting signal C(t) may not be known as the k-space data is being acquired. Consequently, it is necessary to time stamp the data as it is acquired. This enables the correction according to equation (3) to be made later when the value of weighting signal C(t) is known precisely for the moment the k-space data is acquired.

A number of methods may be used to produce the sample values $C_i$ for weighting signal C(t). For example, they may be produced using the "MR Smartprep" feature available on the above General Electric MRI system. This method monitors the NMR signal strength from a region of interest by executing a pulse sequence which is interleaved with the acquisition of the image data described above. If this pulse sequence is executed often enough during the dynamic study, a current value of the weighting signal C(t) can be maintained as image data is acquired. Normalization can then be performed at once. The pulse sequence used for gathering the C(t) data can be a standard gradient echo sequence with a slice selective rf pulse, for example, defining a slice perpendicular to the abdominal aorta or other artery to indicate contrast arrival. Rather than performing Fourier transformation on the acquired signal, the integrated signal may be used to represent C(t). For a more precise definition of the contrast signal appearing in a particular vessel an rf pulse defining a cylindrical excitation passing through the vessel of interest may also be used.

In the alternative, the values for C(t) may be derived from the acquired image data. For example, the 2D images that are reconstructed as described above may be used to produce periodic values $C_i$ during the dynamic study. In this case the operator identifies the ROI on the first 2D image and the intensity values therein are integrated to form the baseline value B. The same intensity values are integrated in subsequent 2D images. Then, as shown in FIG. 9, the baseline value B is subtracted from the ROI signals in each frame to produce the contrast enhancement values $C_i$. The advantage of this method is that it enables one to monitor image contrast at precisely the location in the vasculature that is of interest to the radiologist and it thereby insures that the best artifact suppression will occur in the region of interest. The disadvantage of this method is that the value of C(t) is not known as image data is acquired and the normalization step must be performed retrospectively.

Regardless of the method used to produce the contrast enhancement values $C_i$, these values only indicate the contrast enhancement at discrete moments during the dynamic study. If the 2D images are used to produce the values $C_i$, for example, one value $C_i$ is produced for each acquired image frame. More specifically, each value $C_i$ represents the contrast enhancement at the moment the central k-space views (i.e. "A" in the above sequences) are acquired for each image frame. On the other hand, if the "MR Smartprep" method is used, its pulse sequence can be interleaved and executed more often than once per image frame, but even it cannot be executed too often without increasing scan time and reducing the temporal resolution of the dynamic study.

Accordingly, it is a teaching of the present invention that a smooth curve is fit to the contrast enhancement values $C_i$ using interpolation to produce the contrast enhancement curve C(t):

$$C(t) = \text{Interp}(C_i). \qquad (4)$$

where "Interp" indicates interpolation.

The "date stamp" associated with each acquired NMR signal may then be used to retrieve the contrast enhancement value (C) at the corresponding time (t).

We claim:

1. A method for producing a contrast enhanced magnetic resonance image of a subject from NMR data acquired during a dynamic study, the steps comprising:

a) injecting a contrast agent into the subject;

b) executing an NMR pulse sequence to acquire NMR sample signals from a selected three-dimensional k-space during a time segment of the dynamic study to form a three-dimensional data set;

c) repeating step b) at a succession of time segments during the dynamic study to form a corresponding plurality of additional three-dimensional data sets;

d) selecting a subset of the three-dimensional data sets;

e) reconstructing a two-dimensional image from each three-dimensional data set using the selected subset of data to form a succession of two-dimensional images which depict the subject during the dynamic study;

f) selecting one or more of said three-dimensional data sets; and g) reconstructing a three-dimensional frame image from each selected three-dimensional data set.

2. The method as recited in claim 1 which includes:

h) producing a two-dimensional image by projecting the three-dimensional frame image.

3. The method as recited in claim 1 in which a second one of said three-dimensional data sets is selected, a second three-dimensional frame image is reconstructed therefrom, and a three-dimensional difference frame image is produced from said two three-dimensional frame images.

4. The method as recited in claim 3 which includes:

h) producing a two-dimensional image by projecting the three-dimensional difference frame image.

5. The method as recited in claim 1 in which the subset of data selected in step d) includes sample signals from a single two-dimensional plane in said three-dimensional k-space.

6. The method as recited in claim 5 in which the subset of data is further limited to sample signals near the center of said three-dimensional k-space.

7. The method as recited in claim 1 which includes:

h) selecting a region of interest in the reconstructed two-dimensional images and producing a signal indicative of the contrast enhancement from image data in said region of interest.

8. A method for producing a contrast enhanced magnetic resonance image of a subject from NMR data acquired during a dynamic study, the steps comprising:

a) injecting a contrast agent into the subject;

b) executing an NMR pulse sequence to acquire NMR sample signals from a selected three-dimensional k-space during a time segment of the dynamic study to form a three-dimensional data set;

c) repeating step b) at a succession of time segments during the dynamic study to form a corresponding plurality of additional three-dimensional data sets;

d) producing contrast enhancement values which indicate the magnitude of increase in NMR sample signals due to the contrast agent at successive time intervals during the dynamic study;

e) normalizing the NMR sample signals in one of the three-dimensional data sets using contrast enhancement values from times corresponding to the times at which the NMR sample signals are acquired; and f) reconstructing an image using the normalized NMR sample signals.

9. The method as recited in claim 8 which includes:

g) executing an NMR pulse sequence to acquire NMR sample signals from the selected three-dimensional k-space prior to the contrast agent entering a region of interest in the subject to form a baseline data set; and the normalizing step e) includes subtracting the baseline data set from corresponding NMR sample signals in the one three-dimensional data set to form a difference data set.

10. The method as recited in claim 9 in which the normalizing step e) further includes dividing the difference data set by said contrast enhancement value.

11. The method as recited in claim 8 in which the contrast enhancement values are produced in step d) by executing an NMR pulse sequence during the dynamic study to acquire NMR signals from a region of interest in the subject and using said NMR signals to produce said contrast enhancement values.

12. The method as recited in claim 8 in which the contrast enhancement values are produced in step d) by processing a subset of each of said three-dimensional data sets.

13. The method as recited in claim 12 in which the subset is NMR sample values from a two-dimensional plane in said three-dimensional k-space, and the processing includes reconstructing a two-dimensional image from said subset.

14. The method as recited in claim 13 in which the contrast enhancement values are calculated from values in a selected region of interest in said two-dimensional images.

15. The method as recited in claim 8 in which contrast enhancement values are calculated for times corresponding to the times at which the NMR sample signals are acquired by interpolating between the contrast enhancement values produced at successive time intervals.

* * * * *